US008032819B2

(12) United States Patent
Abe (10) Patent No.: US 8,032,819 B2
(45) Date of Patent: Oct. 4, 2011

(54) CSA 5-3 COMPRESSOR CIRCUIT AND CARRY-SAVE ADDER CIRCUIT USING SAME

(75) Inventor: Kazuhiro Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 985 days.

(21) Appl. No.: 11/905,324

(22) Filed: Sep. 28, 2007

(65) Prior Publication Data
US 2008/0052611 A1   Feb. 28, 2008

Related U.S. Application Data (63) Continuation of application No. PCT/JP2005/006336, filed on Mar. 31, 2005.

(51) Int. Cl.
*H04L 1/00*   (2006.01)
(52) U.S. Cl. .................. 714/823; 714/724; 714/824
(58) Field of Classification Search .............. 714/823, 714/724, 720, 824
See application file for complete search history.

(56) References Cited

U.S. PATENT DOCUMENTS

| | | | | |
|---|---|---|---|---|
| 5,210,833 | A * | 5/1993 | Kaneko | 712/236 |
| 5,903,576 | A * | 5/1999 | Yoshiba | 714/720 |
| 5,920,498 | A | 7/1999 | Goto | |
| 7,337,379 | B2 * | 2/2008 | Hiraide | 714/724 |

FOREIGN PATENT DOCUMENTS

| | | |
|---|---|---|
| GB | 2 401 962 A | 11/2004 |
| GB | 2 403 567 A | 1/2005 |
| JP | 6-250822 | 9/1994 |

OTHER PUBLICATIONS

Japanese Office Action issued on Mar. 17, 2009 in corresponding Japanese Patent Application 2007-512385.
Patent Abstracts of Japan: Japanese Publication No. 10-124297, Publication Date: May 15, 1998, Inventor: Gensuke Goto. *Abstract Only*.
Patent Abstracts of Japan: Japanese Publication No. 7-219746, Publication Date: Aug. 18, 1995, Inventor: Toshihiro Minami et al. *Abstract Only*.
Kanie Y. et al.,"4-2 Compressor with Complementary Pass-Transistor Logic", IEICE Transactions on Electronics, Electronics Society, Tokyo, JP, vol. E77-C, No. 4, Apr. 1, 1994, pp. 647-649.
Wallace C. S., "A Suggestion for a Fast Multiplier", IEEE Transactions on Electronic Computers, IEEE, U, vol. EC-12, No. 1, Feb. 1, 1964, pp. 14-17.
European Search Report mailed Aug. 11, 2009 and issued in corresponding European Patent Application 057280.13.3.
European Office Action, mailed May 25, 2011 for corresponding European Application No. 05728013.3.

* cited by examiner

*Primary Examiner* — Fritz Alphonse
(74) *Attorney, Agent, or Firm* — Fujitsu Patent Center (57) ABSTRACT

At least two Exclusive-OR (EOR) circuits for carry-out which output carry-out bits and the complementary signals thereof are provided in the 5-3 compressor circuits constituted by an Exclusive-OR (EOR) circuit group, and dual lanes are employed at least for carry-out. As a result, the number of inverters required can be reduced, increases in delay time can be suppressed, and fast addition operation can be achieved.

12 Claims, 10 Drawing Sheets

| PRIOR ART | | |
|---|---|---|
| CSA STAGE 1 | a2->c | 3 INVERTER STAGES, 3 PASS TRANSISTOR STAGES |
| | a4->co->HIGHER-DIGIT c | 4 INVERTER STAGES, 3 PASS TRANSISTOR STAGES |
| CSA STAGE 2 | a2->c->SECOND-STAGE a2->c | 6 INVERTER STAGES, 6 PASS TRANSISTOR STAGES |
| | a4->co->HIGHER-DIGIT c ->SECOND-STAGE a4 ->co-> HIGHER-DIGIT c | 8 INVERTER STAGES, 6 PASS TRANSISTOR STAGES |
| CSA STAGE 3 | a2->c->SECOND-STAGE a2 ->c->THIRD-STAGE a2->c | 9 INVERTER STAGES, 9 PASS TRANSISTOR STAGES |
| | a4->co->HIGHER-DIGIT c ->SECOND-STAGE a4 ->co-> HIGHER-DIGIT c->THIRD-STAGE a4->co->HIGHER-DIGIT c | 12 INVERTER STAGES, 9 PASS TRANSISTOR STAGES |
| CSA STAGE 4 | a2->c-> SECOND-STAGE a2->c-> THIRD-STAGE a2-> c-> FOURTH-STAGE a2-> c | 12 INVERTER STAGES, 12 PASS TRANSISTOR STAGES |
| | a4-> co-> HIGHER-DIGIT c-> SECOND-STAGE a4-> HIGHER-DIGIT c-> THIRD-STAGE a4-> co-> HIGHER-DIGIT c-> FOURTH-STAGE a4-> co-> HIGHER-DIGIT c | 16 INVERTER STAGES, 12 PASS TRANSISTOR STAGES |

| FIRST EMBODIMENT | | |
|---|---|---|
| CSA STAGE 1 | a2->c | 3 INVERTER STAGES, 3 PASS TRANSISTOR STAGES |
| | a4->co->HIGHER-DIGIT c | 3 INVERTER STAGES, 3 PASS TRANSISTOR STAGES |
| CSA STAGE 2 | a2->c->SECOND-STAGE a2->c | 5 INVERTER STAGES, 6 PASS TRANSISTOR STAGES |
| | a4->co->HIGHER-DIGIT c->SECOND-STAGE a4->co-> HIGHER-DIGIT c | 5 INVERTER STAGES, 6 PASS TRANSISTOR STAGES |
| CSA STAGE 3 | a2->c->SECOND-STAGE a2->c->THIRD-STAGE a2->c | 7 INVERTER STAGES, 9 PASS TRANSISTOR STAGES |
| | a4->co->HIGHER-DIGIT c->SECOND-STAGE a4->co-> HIGHER-DIGIT c->THIRD-STAGE a4->co->HIGHER-DIGIT c | 7 INVERTER STAGES, 9 PASS TRANSISTOR STAGES |
| CSA STAGE 4 | a2->c->SECOND-STAGE a2->c->THIRD-STAGE a2->c-> FOURTH-STAGE a2->c | 9 INVERTER STAGES, 12 PASS TRANSISTOR STAGES |
| | a4-> co-> HIGHER-DIGIT c-> SECOND-STAGE a4-> co-> HIGHER-DIGIT c-> THIRD-STAGE a4-> co-> HIGHER-DIGIT c-> FOURTH-STAGE a4-> co-> HIGHER-DIGIT c | 9 INVERTER STAGES, 12 PASS TRANSISTOR STAGES |

| SECOND EMBODIMENT | | |
|---|---|---|
| CSA STAGE 1 | a2->c | 3 INVERTER STAGES, 3 PASS TRANSISTOR STAGES |
| | a4->co->HIGHER-DIGIT c | 3 INVERTER STAGES, 3 PASS TRANSISTOR STAGES |
| CSA STAGE 2 | a2->c->SECOND-STAGE a2->c | 6 INVERTER STAGES, 6 PASS TRANSISTOR STAGES |
| | a4->co->HIGHER-DIGIT c->SECOND-STAGE a4->co-> HIGHER-DIGIT c | 6 INVERTER STAGES, 6 PASS TRANSISTOR STAGES |
| CSA STAGE 3 | a2->c->SECOND-STAGE a2->c->THIRD-STAGE a2->c | 9 INVERTER STAGES, 9 PASS TRANSISTOR STAGES |
| | a4->co->HIGHER-DIGIT c->SECOND-STAGE a4->co-> HIGHER-DIGIT c->THIRD-STAGE a4->co->HIGHER-DIGIT c | 9 INVERTER STAGES, 9 PASS TRANSISTOR STAGES |
| CSA STAGE 4 | a2->c->SECOND-STAGE a2->c->THIRD-STAGE a2->c-> FOURTH-STAGE a2->c | 12 INVERTER STAGES, 12 PASS TRANSISTOR STAGES |
| | a4-> co-> HIGHER-DIGIT c-> SECOND-STAGE a4-> co-> HIGHER-DIGIT c-> THIRD-STAGE a4-> co-> HIGHER-DIGIT c-> FOURTH-STAGE a4-> co-> HIGHER-DIGIT c | 12 INVERTER STAGES, 12 PASS TRANSISTOR STAGES |

FIG.6

| CSA STAGE NUMBER | STAGE 1 | STAGE 2 | STAGE 3 | STAGE 4 |
|---|---|---|---|---|
| PRIOR ART | 4/3 | 8/6 | 12/9 | 16/12 |
| FIRST EMBODIMENT | 3/3 | 5/6 | 7/9 | 9/12 |
| SECOND EMBODIMENT | 3/3 | 6/6 | 9/9 | 12/12 |

PRIOR ART

| |
|---|
| $A1 \oplus A2 = A1 \cdot \overline{A2} + \overline{A1} \cdot A2$ |
| $S = A1 \oplus A2 \oplus A3 \oplus A4 \oplus CI$ |
| $C = (A1 \oplus A2 \oplus A3 \oplus A4) \cdot CI + \overline{(A1 \oplus A2 \oplus A3 \oplus A4)} \cdot A1$<br>$= A1 \cdot CI + CI \cdot (A1 \oplus A2 \oplus A3) + \overline{(A1 \oplus A2 \oplus A3)} \cdot A1$ |
| $CO = \overline{(A3 \oplus A4)} \cdot A2 + \overline{(A3 \oplus A4)} \cdot A4$<br>$= A2 \cdot A3 + A3 \cdot A4 + A4 \cdot A2$ |
| S:Sum, C:Carry, CO:Carry out, CI:Carry in,<br>A1 TO A4: INPUTS<br>$\oplus$ INDICATES EXCLUSIVE OR, + INDICATES LOGICAL SUM, $\cdot$ INDICATES LOGICAL PRODUCT |

CSA 5-3 COMPRESSOR CIRCUIT AND CARRY-SAVE ADDER CIRCUIT USING SAME

CROSS REFERENCE TO RELATED APPLICATIONS

This application is a continuation of International Application No. PCT/JP2005/006336, filed on Mar. 31, 2005, now pending, herein incorporated by reference.

TECHNICAL FIELD

This invention relates to a 5-3 compressor circuit for a carry-save adder circuit, which adds partial products when performing multiplication, and to a carry-save adder circuit, and in particular relates to a 5-3 compressor circuit for a carry-save adder circuit which performs high-speed addition operations and to a carry-save adder circuit.

BACKGROUND ART

As processing speeds of CPUs (Central Processor Units) have increased, CPU configurations have grown more complex. For example, a CPU comprises a computation unit, an instruction unit, a cache memory, a cache controller unit, and various registers. With advances in integration technology in recent years, there have been trends toward incorporation of CPUs on a single chip, and a need has arisen for faster operation speeds for each of the units in a CPU.

Figure 7:
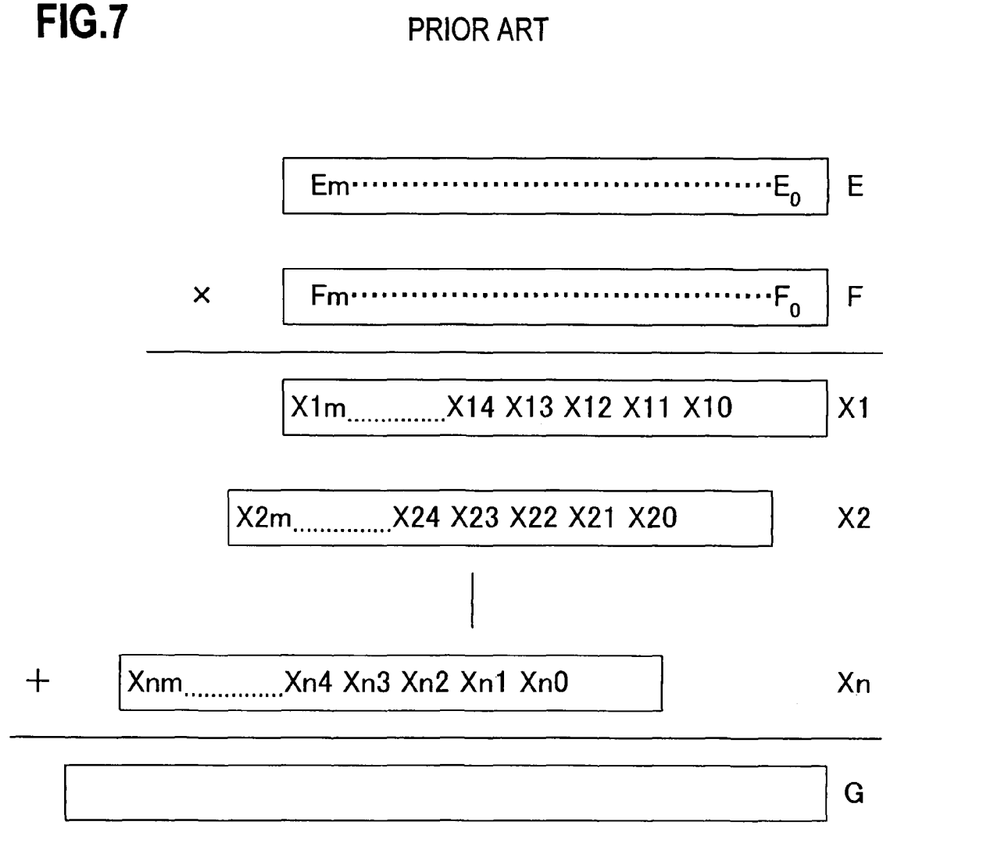
FIG. 7 explains partial products in multiplication.

In a computation unit, there exist adders/subtractors, logical computation circuits, shift circuits, and similar. Of these, carry-save adder circuits, which are circuits to add partial products when performing multiplication, are used as adders. FIG. 7 explains multiplication operation; for example, in order to multiply E, consisting of Em through E0, and F, consisting of Fm through F0, E, that is, (Em~E0), is multiplied by each of the digits of F, and addition of the multiplication results (called partial products) is performed. Here, if the multiplication result is G, then the multiplication result is obtained from the following equation.

$$G=(Em\sim E0)\times F0+(Em\sim E0)\times F1+\ldots+(Em\sim E0)\times Fm$$

In FIG. 7, the partial product X1 (X1m~X10) is (Em~E0)×F0, the partial product X2 (X2m~X20) is (Em~E0)×F1, and similarly thereafter, the partial product Xn (Xnm~Xn0) is (Em~E0)×Fm. These partial products are added to obtain the final multiplication result G.

Figure 8:
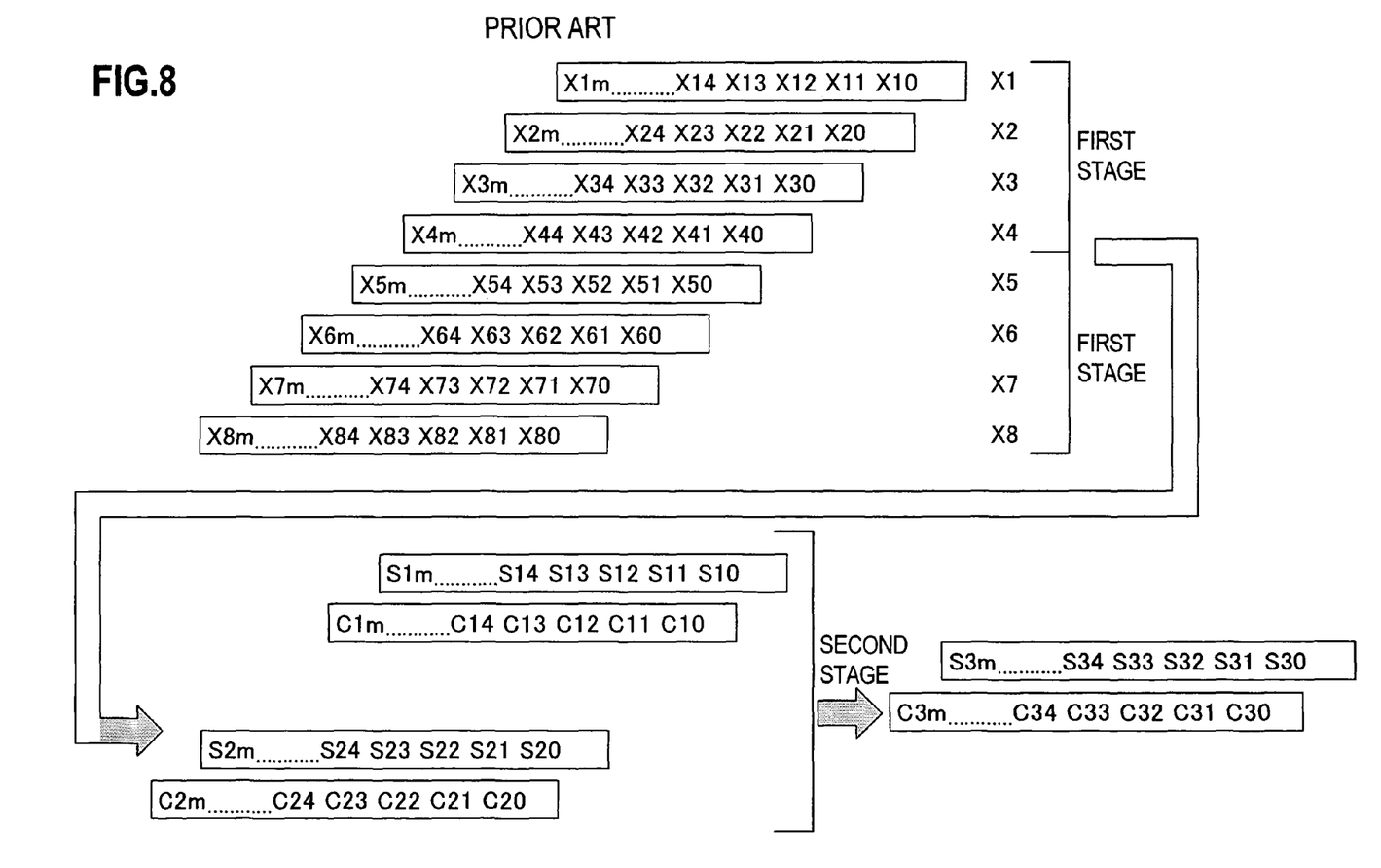
FIG. 8 explains CSA addition operation of partial products.

Operation of a carry-save adder which adds these partial products is explained in FIG. 8. In FIG. 8, an example in which eight partial products X1 to X8 are added is shown. In the first stage, the carry-save adder (CSA) circuit calculates the addition results S1m to S10 for each digit and the carry bits C1m to C10 for each digit for the partial products X1 to X4, and the addition results S2m to S20 for each digit and the carry bits C2m to C20 for each digit for the partial products X5 to X8. In the second stage, the addition results S1m to S10, carry bits for each digit C1m to C10, addition results S2m to S20, and carry bits for each digit C2m to C20 are added for each digit, to obtain addition results S3m to S30 and carry bits C3m to C30 (see for example Japanese Patent Laid-open Hei No. 2-501242).

Figure 9:
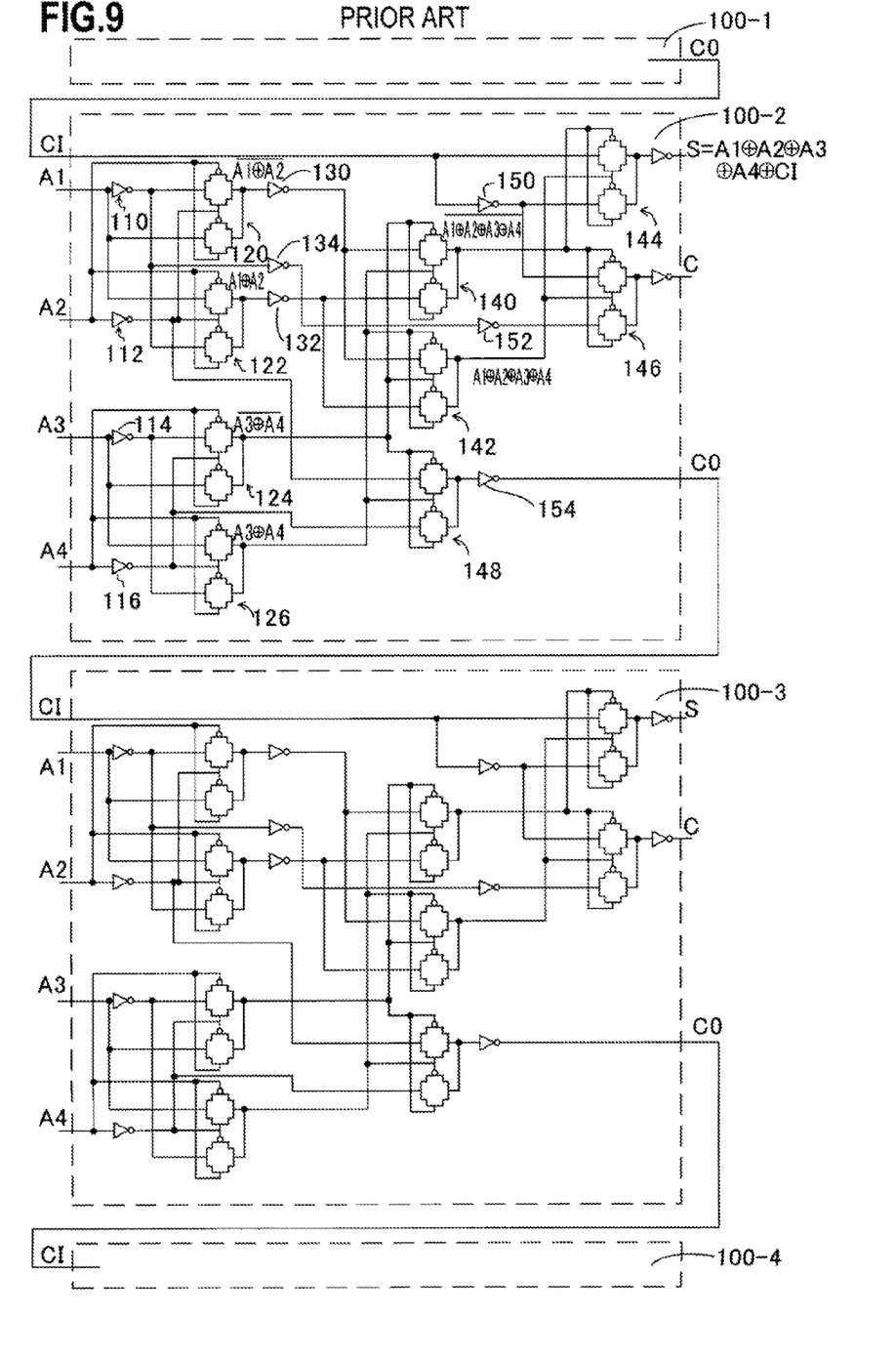
FIG. 9 is a circuit diagram of a 5-3 compressor circuit of the prior art.

This CSA is configured by connecting 5-3 compressor circuits for each digit. FIG. 9 shows the configuration of a conventional CSA using 5-3 compressor circuits. In FIG. 9, the 5-3 compressor circuits 100-1, 100-2, 100-3 and 100-4 are connected in series. The 5-3 compressor circuit 100-2 (100-1, 100-3, 100-4) used in the CSA mainly comprises exclusive-OR circuits (EORs). That is, the exclusive OR of two signals is generated and used.

That is, in order to generate the complementary signals of the inputs (A1, A2, A3, A4), inverter gates 110, 112, 114, 116 are inserted, and pairs of pass transistors 120, 122, 124, 126 compute the EORs. That is, output of the EOR of A1 and A2 is the sum of the product of A1 and the inverse of A2 with the product of the inverse of A1 and A2, as shown in FIG. 10.

Hence the EOR circuit 122 outputs the EOR of A1 and A2, the EOR circuit 120 outputs the inverse of the EOR of A1 and A2, the EOR circuit 126 outputs the EOR of A3 and A4, and the EOR circuit 124 outputs the inverse of the EOR of A3 and A4.

Similarly, the EOR circuit 142 outputs the EOR of A1, A2, A3 and A4, and the EOR circuit 140 outputs the inverse of the EOR of A1, A2, A3 and A4; the EOR circuit 144 which receives these outputs outputs the EOR of A1, A2, A3, A4, and CI as the S (SUM). Similarly, the EOR circuit 146, which receives A1 via the inverse gates 134 and 152, the outputs of the EOR circuits 140 and 142, and CI via an inverse gate, outputs the carry result C shown in FIG. 10.

Figure 10:
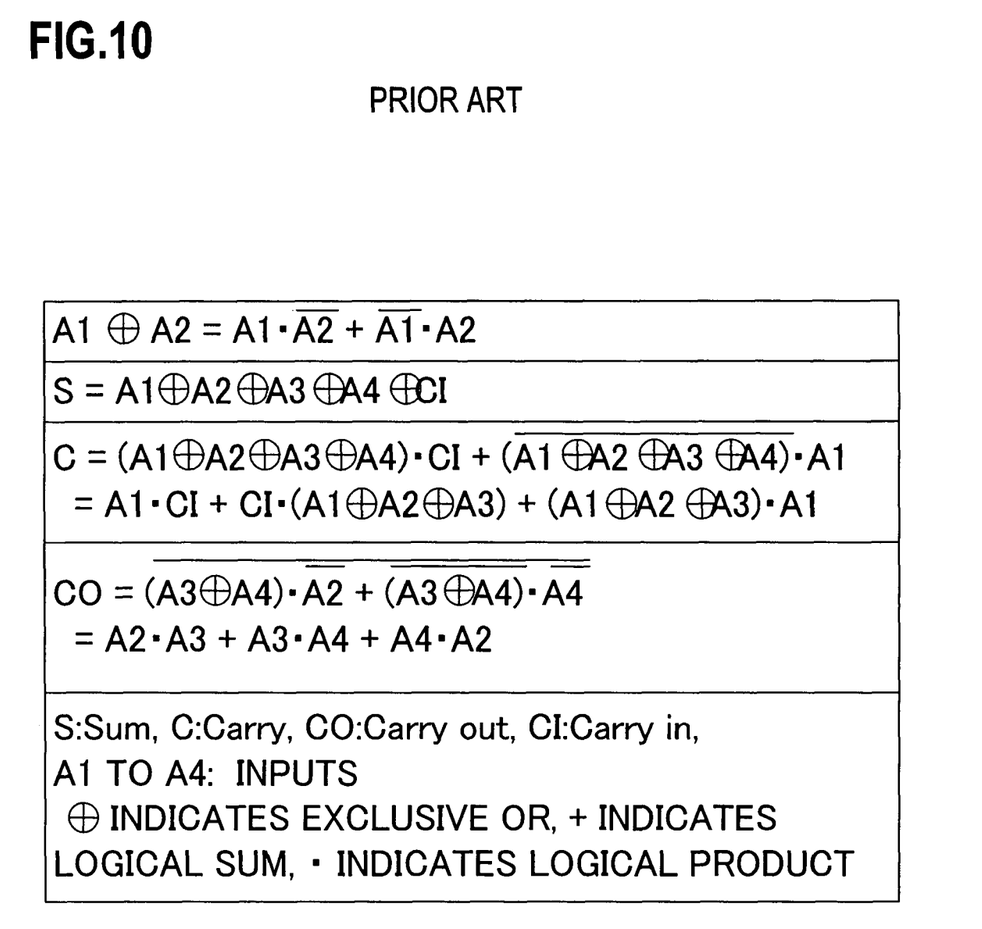
FIG. 10 explains sum, carry, and carry-out computation operation of the EOR circuit of FIG. 9.

Further, the EOR circuit 148, which receives the output of EOR circuit 124, the output of EOR circuit 126, the inverse of A2 via an inverter gate 124, and the inverse of A4 via an inverter gate 116, outputs the carry-out result CO in FIG. 10 via the inverter gate 154. This carry-out CO is output as the carry-in CI of the upper-digit 5-3 compressor circuit 100-3.

In this way, the carry-out CO is the carry result to the upper digit, and the carry C is carried to the next stage (see FIG. 8). That is, this adder circuit is a five-input, three-output adder circuit.

However, in the technology of the prior art, complementary signals are required as input for EOR computation, as shown in FIG. 10, so that inverter gates must be inserted, and hence delay times are lengthened and high-speed addition operation is difficult. In particular, in a CSA which performs multiplication of partial products with a plurality of digits, as in FIG. 8, the delay time of one adder circuit accumulates, so that the addition time of partial products is lengthened.

Hence an object of this invention is to provide a 5-3 compressor circuit for a CSA to realize high-speed operation of the adder circuit when performing EOR computations, as well as a carry-save adder circuit using this 5-3 compressor circuit.

A further object of this invention is to provide a 5-3 compressor circuit for a CSA to prevent increases in the delay time necessary for generation of complementary signals for EOR computation, and a carry-save adder circuit using this 5-3 compressor circuit.

Still a further object of this invention is to provide a 5-3 compressor circuit for a CSA to prevent increases in delay time due to inverter gates for EOR computation, and a carry-save adder circuit using this 5-3 compressor circuit.

DISCLOSURE OF THE INVENTION

In order to attain these objects, a 5-3 compressor circuit for a CSA of this invention receives four input signals and a lower-digit carry-out input, and computes the addition bits, a carry bit, and the carry-out bit. This compressor circuit has four first-stage EOR circuits, which receive the four input signals and the complementary signals of these, perform EOR computation of each two input signals, and output two EOR outputs and their complementary signals; two second-stage EOR circuits, which receive the outputs of the four first-stage EOR circuits, perform EOR computations of the two EOR outputs, and output one EOR output and the complementary signal thereof; a third-stage EOR circuit, which receives the outputs of the two second-stage EOR circuits and the carry-out bit, performs EOR computation of the EOR outputs and the carry-out bit, and outputs addition bits; a carry-output EOR circuit, which receives the outputs of the two second-stage EOR circuits, the carry-out bit, and one of the four-input signals, performs EOR computation of the EOR outputs, the carry-out bit, and the one input signal, and outputs a carry bit; and two carry-out EOR circuits, which receive the outputs of two first-stage EOR circuits and two complementary signals of the input signals, perform EOR computation of the two EOR outputs and the two complementary signals, and output the carry-out bit and the complementary signal thereof.

Further, a carry-save adder circuit of this invention connects to the carry-out input a plurality of 5-3 compressor circuits for a CSA, which receive four input signals and a lower-digit carry-out input, and compute addition bits, a carry bit, and the carry-out bit. Each of the 5-3 compressor circuits for a CSA has four first-stage EOR circuits, which receive the four input signals and the complementary signals of these, perform EOR computation of each two input signals, and output two EOR outputs and their complementary signals; two second-stage EOR circuits, which receive the outputs of the four first-stage EOR circuits, perform EOR computations of the two EOR outputs, and output one EOR output and the complementary signal thereof; a third-stage EOR circuit, which receives the outputs of the two second-stage EOR circuits and the carry-out bit, performs EOR computation of the EOR outputs and the carry-out bit, and outputs addition bits; a carry-output EOR circuit, which receives the outputs of the two second-stage EOR circuits, the carry-out bit, and one of the four input signals, performs EOR computation of the EOR outputs, the carry-out bit, and the one input signal, and outputs a carry bit; and two carry-out EOR circuits, which receive the outputs of two first-stage EOR circuits and two complementary signals of the input signals, perform EOR computation of the two EOR outputs and the two complementary signals, and output the carry-out bit and the complementary signal thereof.

Further, in this invention it is preferable that the third-stage EOR circuit have a pair of EOR circuits which receive the outputs from the two second-stage EOR circuits and the carry-out bit, perform EOR computation of the EOR outputs and the carry-out bit, and output the addition bits and the complementary signals thereof, and that the carry-output EOR circuit have a pair of EOR circuits which receive the outputs of the two second-stage EOR circuits, the carry-out bit, and one of the four input signals, perform EOR computation of the EOR outputs, the carry-out bit, and the one input signal, and output a carry bit and the complementary signal thereof.

Further, in this invention it is preferable that four inverters which generate complementary signals of the four input signals be further provided.

Further, in this invention it is preferable that the four first-stage EOR circuits receive the four input signals and the complementary signals thereof from a data bus.

Further, in this invention it is preferable that the four first-stage EOR circuits and the four inverters receive the four input signals from a data bus.

Further, in this invention it is preferable that a plurality of the plurality of 5-3 compressor circuits is provided in a plurality stage, and that the addition bits and carry bits of the plurality of 5-3 compressor circuits of the first stage be input to the plurality of 5-3 compressor circuits of the next stage.

Further, in this invention it is preferable that the four input signals each be partial product signals in multiplication.

In this invention, at least two carry-out EOR circuits which output a carry-out bit and the complementary signal there of are provided in a 5-3 compressor circuit comprising an EOR circuit group, and at least dual lanes for carry-out bits are provided, so that required inverters can be eliminated, increases in delay time can be suppressed, and high-speed adding operation can be achieved.

PREFERRED EMBODIMENTS OF THE INVENTION

Below, embodiments of the invention are explained, in the order of a first embodiment, a second embodiment, and other embodiments; however, these embodiments are examples of the invention, and various modifications are not excluded.

First Embodiment

Figure 1:
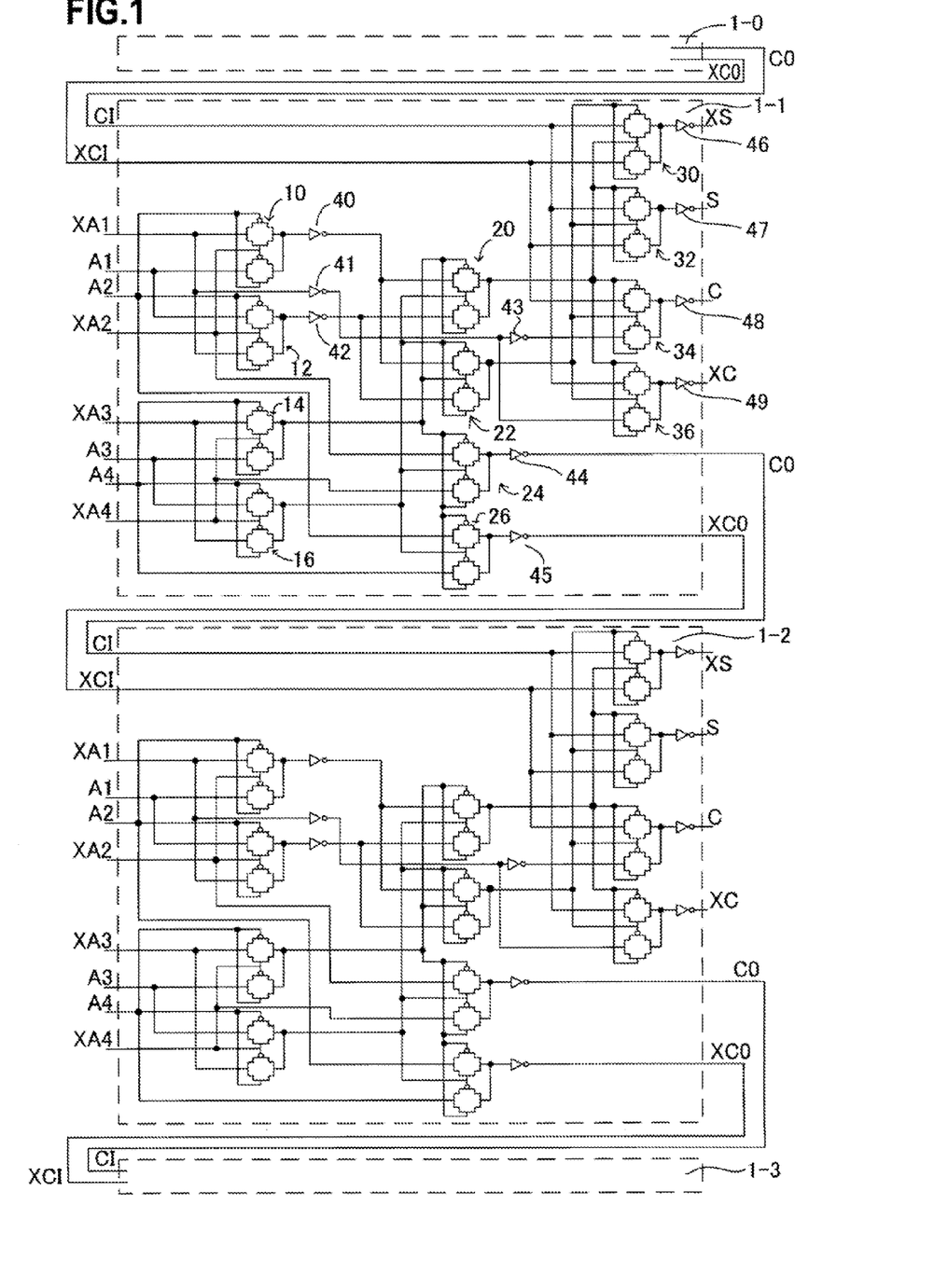
FIG. 1 is a circuit diagram of a 5-3 compressor circuit for a CSA in a first embodiment of the invention.
Figure 2:
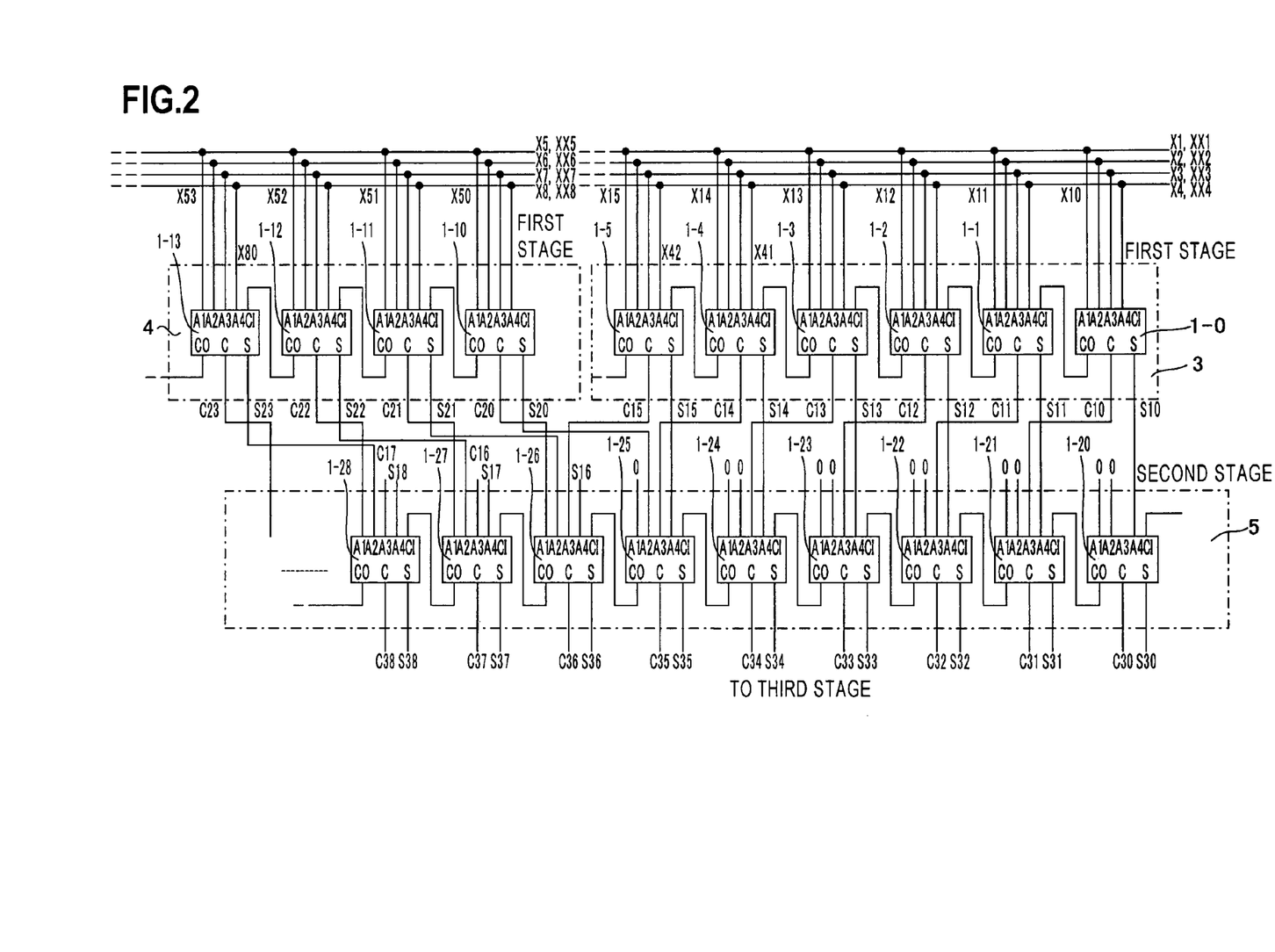
FIG. 2 is a circuit diagram of a carry-save adder using the 5-3 compressor circuit of FIG. 1.

FIG. 1 is a circuit diagram of the 5-3 compressor circuit of the first embodiment of the invention; FIG. 2 is a block diagram of a CSA which uses the 5-3 compressor circuit of FIG. 1.

As shown in FIG. 1, the 5-3 compressor circuits 1-0, 1-1, 1-2, 1-3 are connected in series. Each 5-3 compressor circuit 1-1 (1-0, 1-2, 1-3) comprises a three-stage EOR circuit group. Each EOR circuit comprises a pair of pass transistors; as shown in FIG. 10, the EOR outputs A1 and A2 are used in computing the sum of the product of A1 and the inverse of A2 with the product of the inverse of A1 and A2.

In this embodiment, by employing dual lanes which use both complementary signals, high-speed operation is attained. That is, the inputs (A1, A2, A3, A4) and the complementary signals thereof (XA1, XA2, XA3, XA4) are input to each of the EORs 10, 12, 14, 16 in the first stage. Hence the EOR circuit 12 outputs the EOR of A1 and A2, the EOR circuit 10 takes the inverse of the EOR of A1 and A2, the EOR circuit 16 takes the EOR of A3 and A4, and the EOR circuit 14 takes the inverse of the EOR of A3 and A4.

Similarly, the EOR circuit 22 of the second state outputs the EOR of A1, A2, A3 and A4, the EOR circuit 20 outputs the inverse of the EOR of A1, A2, A3 and A4, the EOR circuit 32 of the third stage receiving outputs output takes via the inverting gate 47, as S (SUM), the EOR of A1, A2, A3, A4, and CI. Similarly, the EOR circuit 34 receives XA1 via the inverting gates 41 and 43, outputs of the EOR circuit outputs 20, 22 and XCI, then outputs the carrier C shown in FIG. 10 via the inverting gate 48.

The EOR circuit 24, which receives the output of EOR circuit 14, the output of EOR circuit 16, XA2, and XA4, outputs the carry-out CO of FIG. 10 via the inverter gate 44. This carry-out CO is output as the carry-in CI of the upper-digit 5-3 compressor circuit 1-2. In this way, the carry-out CO is carried to the upper digit, and the carry C is the carry output for the next stage.

In order to generate a complementary signal for the output, the third-stage EOR circuit 30, which receives the output of the second-stage EOR circuit 20, the output of the EOR circuit 22, CI, and XCI (the complementary signal of CI), outputs via the inverter gate 46 the inverse XS of the EOR of A1, A2, A3, A4, and CI. Similarly, the EOR circuit 36, which receives XA1 via the inverter gate 41, and also receives the outputs of the EOR circuits 20 and 22 and CI, outputs via the inverter gate 49 the complementary signal XC of the carry C shown in FIG. 10.

Further, the EOR circuit 26, which receives the output of EOR circuit 14, the output of EOR circuit 16, A2 and A4, outputs via the inverter gate 45 the complementary signal XCO of the carry-out CO of FIG. 10. This carry-out XCO is also output as the carry-in XCI of the upper-digit 5-3 compressor circuit 1-2.

The other 5-3 compressor circuits 1-0, 1-2, 1-3 are similarly configured. In this way, in a circuit which uses numerous exclusive-OR circuits such as the 5-3 compressor circuit, by focusing on the fact that an EOR circuit can reduce to zero the delay time to generate a signal and its inverted signal, and making efficient use of these two signals, high-speed operation can be achieved.

Through use of dual lanes employing both complementary signals, although the number of transistors increases in the amount of the increased output (EOR circuits 30, 36, 26 in FIG. 1), because complementary signals are handled, there is no need to generate inverses of signals using an inverter gate. That is, compared with the prior art in FIG. 9, the inverter gates 110, 112, 114, 116, 150 can be eliminated. Hence to this extent the number of transistors can be reduced, and as a result increases in the number of transistors can be suppressed.

The carry-out output (CO) of each CSA cell 1-1 is connected to the carry-in input (CI) of the higher-digit CSA cell 1-2; the number of path stages, from the input to carry-out, through the higher-digit carry-in, the higher-digit SUM, up to the carry, is one greater than the path not passing through the carry-out and carry-in, and is the critical path. The complementary signal XCO of the carry-out is generated and passed to the higher digit to achieve faster operation of the path. As a result, the critical path speed can be increased, and in terms of stages, the path from input to SUM and carry can be made the same, regardless of whether carry-out is passed.

FIG. 2 is a block diagram of a CSA using this circuit. An example of a configuration which performs the operation to add partial products in FIG. 8 is shown. The first CSA 3 performs addition of each of the digits of the partial products X1, X2, X3, X4 of FIG. 8, and the second CSA 4 performs addition of each of the digits of the partial products X5, X6, X7, X8 of FIG. 8. The third CSA 5 performs addition, for each digit, of the addition results S1$m$ to S10 in FIG. 8, carries for each digit C1$m$ to C10, addition results S2$m$ to S20, and carries for each digit C2$m$ to C20, to obtain addition results S3$m$ to S30 and carries C3$m$ to C30.

The CSA 3 is configured by connecting 5-3 compressor circuits 1-0, 1-1, 1-2, 1-3, 1-4, 1-5, shown in FIG. 1, by the lower-digit carry-outs CO. Each of the 5-3 compressor circuits 1-0, 1-1, 1-2, 1-3, 1-4, 1-5 is connected to a bus which transmits the partial products X1, X2, X3, X4 and the inverted signals XX1, XX2, XX3, XX4. Specifically, the first digit X10 of the partial product X1 and the complementary signal thereof XX10 are input to the 5-3 compressor circuit 1-0 of the lowermost-digit (first digit). The second digit X11 of the partial product X1, the complementary signal XX11 thereof, the first digit X20 of the partial product X2, and the complementary signal XX20 thereof are input to the second-digit 5-3 compressor circuit 1-1.

The third digit X12 of the partial product X1 and the complementary signal XX12 thereof, the second digit X21 of the partial product X2 and the complementary signal XX21 thereof, and the first digit X30 of the partial product X3 and the complementary signal XX30 thereof, are input to the third-digit 5-3 compressor circuit 1-2. And, the fourth digit X13 of the partial product X1 and the complementary signal XX13 thereof, the third digit X22 of the partial product X2 and the complementary signal XX22 thereof, the second digit X31 of the partial product X3 and the complementary signal XX31 thereof, and the first digit X40 of the partial product X4 and the complementary signal XX40 thereof, are input to the fourth-digit 5-3 compressor circuit 1-3.

The fifth digit X14 of the partial product X1 and the complementary signal XX14 thereof, the fourth digit X23 of the partial product X2 and the complementary signal XX23 thereof, the third digit X32 of the partial product X3 and the complementary signal XX32 thereof, and the second digit X41 of the partial product X4 and the complementary signal XX41 thereof, are input to the fifth-digit 5-3 compressor circuit 1-4. And, the sixth digit X15 of the partial product X1 and the complementary signal XX15 thereof, the fifth digit X24 of the partial product X2 and the complementary signal XX24 thereof, the fourth digit X33 of the partial product X3 and the complementary signal XX33 thereof, and the third digit X42 of the partial product X4 and the complementary signal XX42 thereof, are input to the sixth-digit compressor circuit 1-5. Inputs are applied similarly thereafter.

Similarly, the CSA 4 is configured by connecting 5-3 compressor circuits 1-10, 1-11, 1-12, 1-13, . . . , shown in FIG. 1 by the lower-digit carry-outs CO. Each of the 5-3 compressor circuits 1-10, 1-11, 1-12, 1-13, . . . is connected to a bus which transmits the partial products X5, X6, X7, X8 and the inverse signals XX5, XX6, XX7, XX8. Specifically, the first digit X50 of the partial product X5 and the complementary signal XX50 thereof are input to the lowermost-digit (first digit) 5-3 compressor circuit 1-10. The second digit X51 of the partial product X5 and the complementary signal XX51 thereof, and the first digit X60 of the partial product X6 and the complementary signal XX60 thereof are input to the second-digit 5-3 compressor circuit 1-11.

The third digit X52 of the partial product X5 and the complementary signal XX52 thereof, the second digit X61 of the partial product X6 and the complementary signal XX61 thereof, and the first digit X70 of the partial product X7 and the complementary signal XX70 thereof are input to the third-digit 5-3 compressor circuit 1-12. The fourth digit X53 of the partial product X5 and the complementary signal XX53 thereof, the third digit X62 of the partial product X6 and the complementary signal XX62 thereof, the second digit X71 of the partial product X7 and the complementary signal XX71 thereof, and the first digit X80 of the partial product X8 and the complementary signal XX80 thereof are input to the fourth-digit 5-3 compressor circuit 1-13. Inputs are applied similarly thereafter.

Further, the CSA 5 is configured by connecting 5-3 compressor circuits 1-20, 1-21, 1-22, 1-23, 1-24, 1-25, 1-26, 1-27, 1-28, . . . , shown in FIG. 1 by the lower-digit carry-outs CO. The sum S20 and XS20 of the 5-3 compressor circuit 1-0 are input to the lowermost-digit (first digit) 5-3 compressor circuit 1-20. The carry C10 and XC10 of the 5-3 compressor circuit 1-0 and sum S11 and XS11 of the 5-3 compressor circuit 1-1 are input to the second-digit 5-3 compressor circuit 1-21. Thereafter inputs are similarly supplied, to the fifth-digit 5-3 compressor circuit 1-24.

The carry C14 and XC14 of the 5-3 compressor circuit 1-4, sum S15 and XS15 of the 5-3 compressor circuit 1-5, and sum S20 and XS20 of the 5-3 compressor circuit 1-10 are input to the sixth-digit 5-3 compressor circuit 1-25. Thereafter inputs are similarly supplied, from the seventh-digit 5-3 compressor circuit 1-26.

In this way, by inputting from a bus line the four inputs and their complementary signals to each of the 5-3 compressor circuits 1-0 to 1-13, 5-3 compressor circuits configured as shown in FIG. 1 can be made to operate. In such addition of partial products to perform multiplication, a plurality of the CSA cells are combined in states and used, so that faster operation can be achieved.

Second Embodiment

Figure 3:
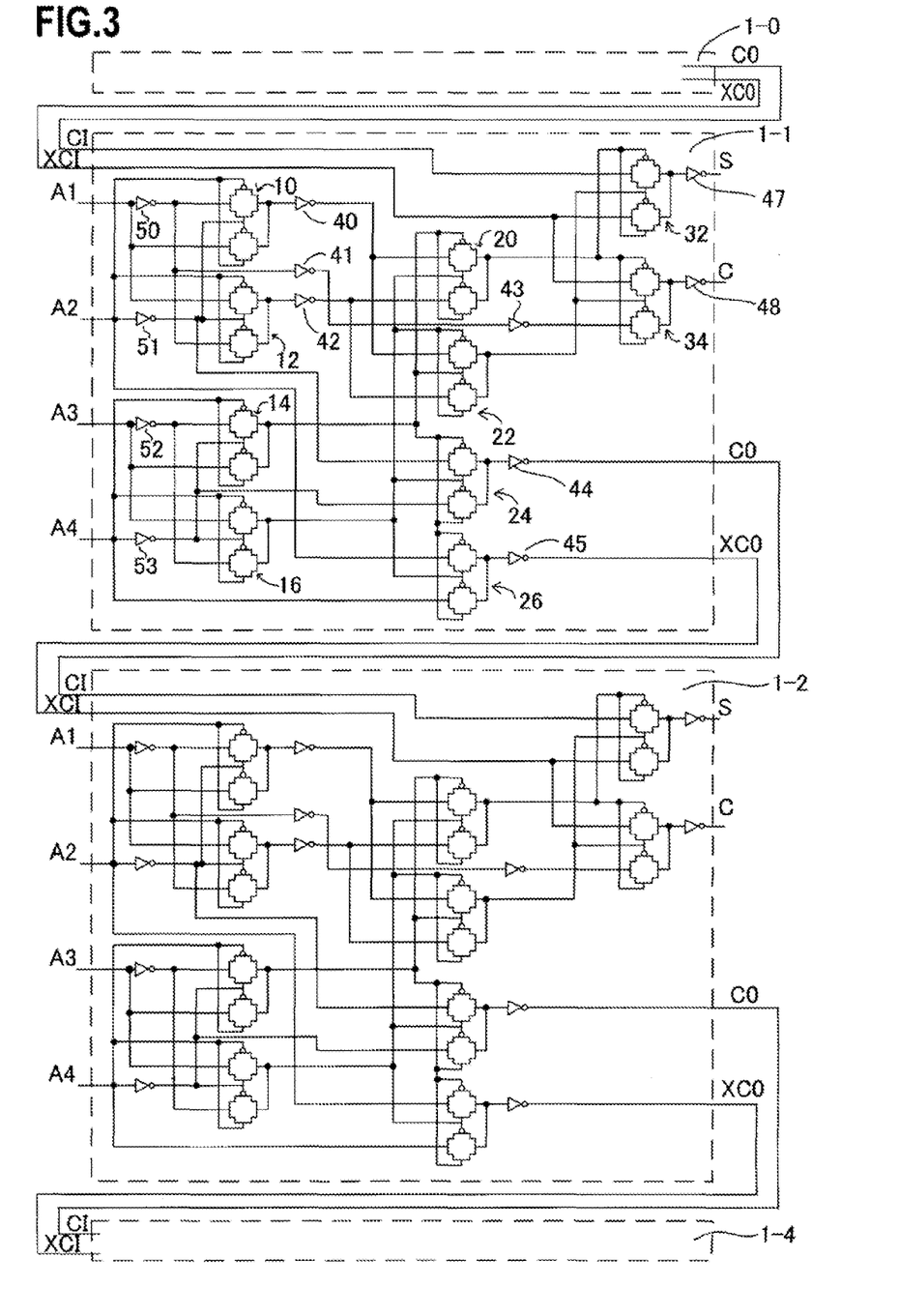
FIG. 3 is a circuit diagram of a 5-3 compressor circuit for a CSA in a second embodiment of the invention.
Figure 4:
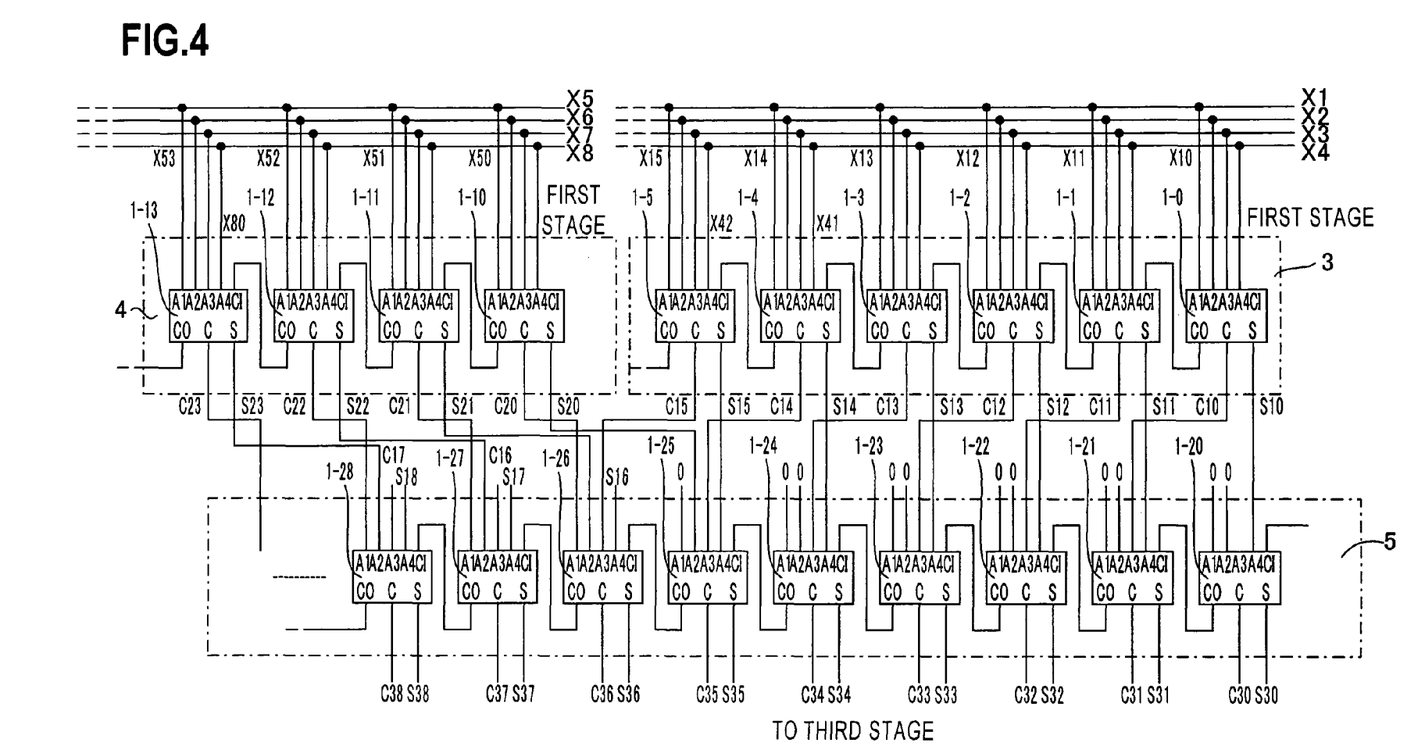
FIG. 4 is a circuit diagram of a carry-save adder using the 5-3 compressor circuit of FIG. 3.

FIG. 3 is a circuit diagram of the 5-3 compressor circuit of a second embodiment of the invention, and FIG. 4 is a block diagram of a CSA employing the 5-3 compressor circuit of FIG. 3. In FIG. 3 and FIG. 4, portions which are the same as in FIG. 1 and FIG. 2 are assigned the same symbols.

As shown in FIG. 3, the 5-3 compressor circuits 1-0, 1-1, 1-2, 1-3 are connected in series. Each of the 5-3 compressor circuits 1-1 (1-0, 1-2, 1-3) comprise a three-stage EOR circuit group. Each EOR circuit comprises a pair of pass transistors, and as shown in FIG. 10, the EOR output of A1 and A2 is computed as the sum of the product of A1 with the inverse of A2 and the product of the inverse of A1 with A2.

In this embodiment, by using dual lanes employing both complementary signals only in the carry-out which is the critical path, high-speed operation is achieved while suppressing increases in chip area. That is, the inputs (A1, A2, A3, A4), and the complementary signals (XA1, XA2, XA3, XA4) obtained by inverting by the inverting gates 50, 51, 52, 53, are input to the first-stage EORs 10, 12, 14, 16. Hence the EOR circuit 12 outputs the EOR of A1 and A2, EOR circuit 10 outputs the inverse of the EOR of A1 and A2, EOR circuit 16 outputs the EOR of A3 and A4, and EOR circuit 14 outputs the inverse of the EOR of A3 and A4.

Similarly, the second-stage EOR circuit 22 outputs the EOR of A1, A2, A3 and A4, and the EOR circuit 20 outputs the inverse of the EOR of A1, A2, A3 and A4; the third-stage EOR circuit 32, on receiving these outputs, outputs as S (SUM), via the inverting gate 47, the EOR of A1, A2, A3, A4, and CI. Similarly, the EOR circuit 34 receives XA1 via the inverting gates 41 and 43, the outputs of EOR circuits 20 and 22, and XCI, and outputs, via the inverting gate 48, the carry C shown in FIG. 10.

The EOR circuit 24, which receives the output of EOR circuit 14, the output of EOR circuit 16, XA2, and XA4, outputs the carry-out CO of FIG. 10 via the inverting gate 44. This carry-out CO is output as the carry-in CI of the upper-digit 5-3 compressor circuit 1-2. In this way, the carry-out CO is the carry to the upper digit, and the carry C is the carry output to the next stage.

In order to generate the complementary signal of the carry-out output, the EOR circuit 26, which receives the output of EOR circuit 14, the output of EOR circuit 16, A2, and A4, outputs the complementary signal XCO of the carry-out CO of FIG. 10 via the inverting gate 45. This carry-out XCO is also output as the carry-in XCI of the upper-digit 5-3 compressor circuit 1-2.

The other 5-3 compressor circuits 1-0, 1-2, 1-3 are similarly configured. In a circuit which uses numerous exclusive-OR circuits such as these 5-3 compressor circuits, by focusing on the fact that an EOR circuit can reduce to zero the delay time to generate a signal and its inverted signal, and making efficient use of these two signals, high-speed operation can be achieved.

By using dual lanes employing both complementary signals, although the number of transistors increases by the amount of the increased output (EOR 26 in FIG. 3), complementary signals are handled, so that the inverted signals of the signals need not be generated. That is, compared with the prior art in FIG. 9, the inverting gate 150 can be eliminated. Hence to this extent the number of transistors can be decreased, and consequently increases in the number of transistors can be suppressed.

Further, the carry-out output (CO) of each CSA cell 1-1 is connected to the carry-in input (CI) of the higher-digit CSA cell 1-2; the number of path stages, from the input to carry-out, through the higher-digit carry-in, the higher-digit SUM, up to the carry, is one greater than the path not passing through the carry-out and carry-in, and is the critical path. The carry-out complementary signal XCO is generated and passed to the higher digit in order to speed this path. As a result, operation on the critical path is made faster, and in terms of stages, the path from input to SUM and carry can be made the same, regardless of whether carry-out is passed.

FIG. 4 is a block diagram of a CSA using this circuit. A configuration performing the partial product addition operation of FIG. 8 is taken as an example. The first CSA 3 performs addition of each of the digits of the partial products X1, X2, X3, X4 in FIG. 8, and the second CSA 4 performs addition of each of the digits of the partial products X5, X6, X7, X8 in FIG. 8. The third CSA 5 performs addition of the addition results S1m to S10 in FIG. 8, the carries for each digit C1m to C10, the addition results S2m to S20, and the carries for each digit C2m to C20, to obtain the addition results S3m to S30 and carries C3m to C30.

The CSA 3 is configured by connecting 5-3 compressor circuits 1-0, 1-1, 1-2, 1-3, 1-4, 1-5 shown in FIG. 3 by the lower-digit carry-outs CO, XCO. Each 5-3 compressor circuit 1-0, 1-1, 1-2, 1-3, 1-4, 1-5 is connected to a-bus which transmits partial products X1, X2, X3, X4. Specifically, the first digit X10 of the partial product X1 is input to the lowermost-digit (first digit) 5-3 compressor circuit 1-0. The second digit X11 of the partial product X1 and first digit X20 of the partial product X2 are input to the second-digit 5-3 compressor circuit 1-1.

The third digit X12 of the partial product X1, second digit X21 of the partial product X2, and first digit X30 of the partial product X3 are input to the third-digit 5-3 compressor circuit 1-2. The fourth digit X13 of the partial product X1, third digit X22 of the partial product X2, second digit X31 of the partial product X3, and first digit X40 of the partial product X4 are input to the fourth-digit 5-3 compressor circuit 1-3.

The fifth digit X14 of the partial product X1, fourth digit X23 of the partial product X2, third digit X32 of the partial product X3, and second digit X41 of the partial product X4 are input to the fifth-digit 5-3 compressor circuit 1-4. The sixth digit X15 of the partial product X1, fifth digit X24 of the partial product X2, fourth digit X33 of the partial product X3, and third digit X42 of the partial product X4 are input to the sixth-digit 5-3 compressor circuit 1-5. Inputs are applied similarly thereafter.

Similarly, the CSA 4 is configured by connecting 5-3 compressor circuits 1-10, 1-11, 1-12, 1-13, ..., shown in FIG. 3 by the lower-digit carry-outs CO, XCO. Each 5-3 compressor circuit 1-10, 1-11, 1-12, 1-13, ..., is connected to a bus which transmits partial products X5, X6, X7, X8. Specifically, the first digit X50 of the partial product X5 is input to the lowermost-digit (first digit) 5-3 compressor circuit 1-10. The second digit X51 of the partial product X5 and first digit X60 of the partial product X6 are input to the second-digit 5-3 compressor circuit 1-11.

The third digit X52 of the partial product X5, second digit X61 of the partial product X6, and first digit X70 of the partial product X7 are input to the third-digit 5-3 compressor circuit 1-12. The fourth digit X53 of the partial product X5, third digit X62 of the partial product X6, second digit X71 of the partial product X7, and first digit X80 of the partial product X8 are input to the fourth-digit 5-3 compressor circuit 1-13. Inputs are applied similarly thereafter.

Further, the CSA 5 is configured by connecting 5-3 compressor circuits 1-20, 1-21, 1-22, 1-23, 1-24, 1-25, 1-26, 1-27, 1-28, ..., of FIG. 3 by the lower-digit carry-outs CO, XCO. The sum S20 of the 5-3 compressor circuit 1-0 is input to the lowermost-digit (first digit) 5-3 compressor circuit 1-20. The carry C10 of the 5-3 compressor circuit 1-0 and the sum S11 of the 5-3 compressor circuit 1-1 are input to the second-digit 5-3 compressor circuit 1-21. Thereafter, inputs are similarly applied up to the fifth-digit 5-3 compressor circuit 1-24.

The carry C14 of 5-3 compressor circuit 1-4, sum S15 of 5-3 compressor circuit 1-5, and sum S20 of 5-3 compressor circuit 1-10 are input to the sixth-digit 5-3 compressor circuit 1-25. Thereafter, inputs are similarly applied to the seventh-digit 5-3 compressor circuit 1-26 and subsequent 5-3 compressor circuits.

In this way, by inputting four inputs from the bus line to each of the 5-3 compressor circuits 1-0 to 1-13, 5-3 compressor circuits configured as in FIG. 3 can be made to operate. Thus in addition of partial products to perform multiplication, a plurality of stages of these CSA cells is used, so that faster processing is possible while suppressing increases in area used.

Figure 5:
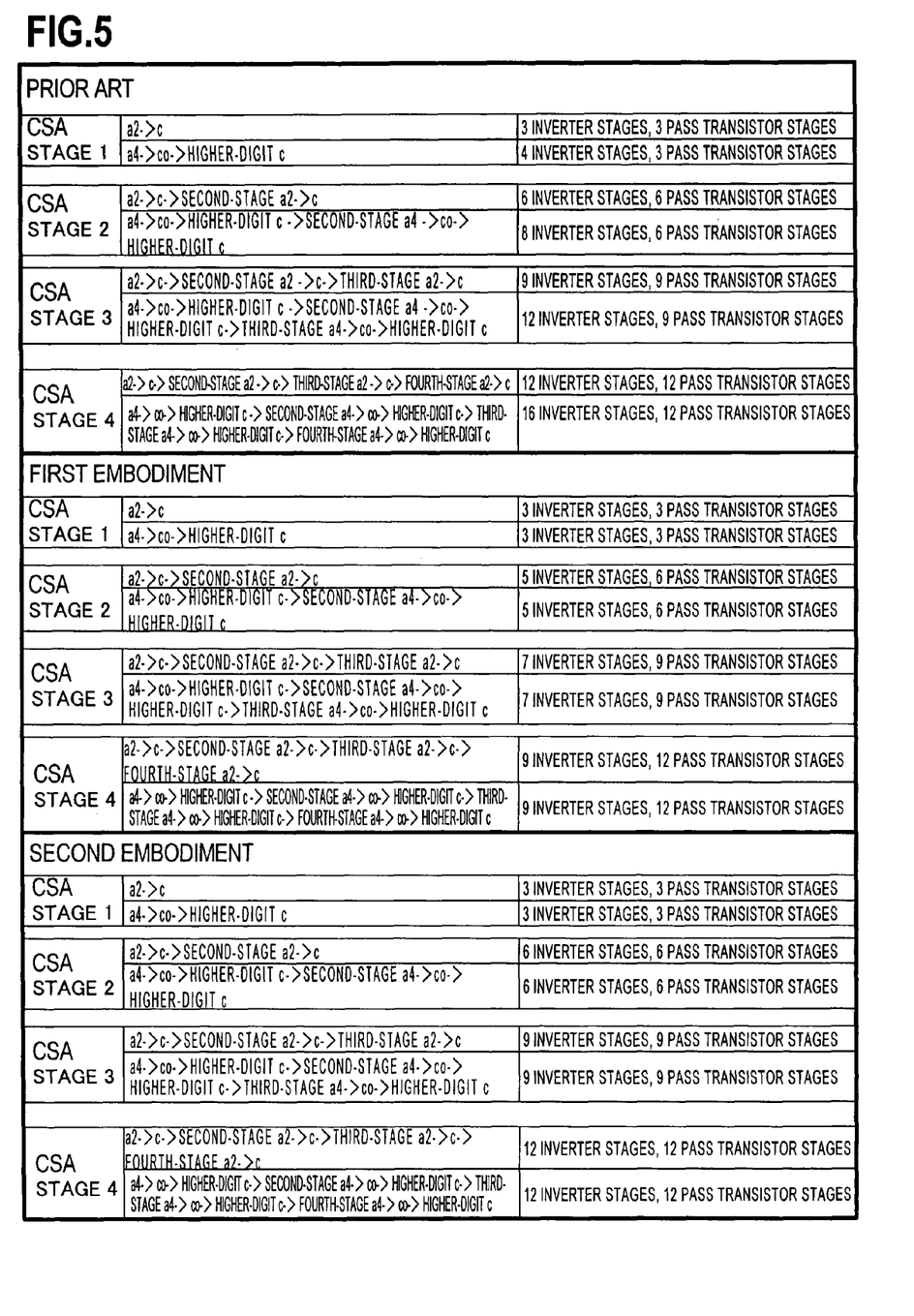
FIG. 5 explains the numbers of inverter stages and pass transistor stages in each stage of a 5-3 compressor circuit of the prior art, of the first embodiment, and of the second embodiment.
Figure 6:
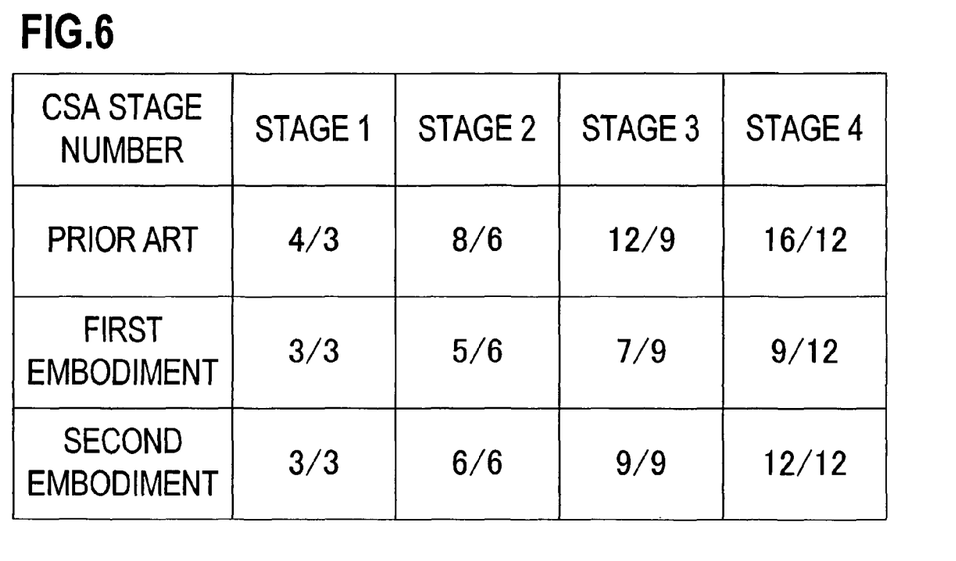
FIG. 6 compares the number of stages of inverters and pass transistors in each stage of a 5-3 compressor circuit of the prior art, of the first embodiment, and of the second embodiment.

FIG. 5 and FIG. 6 compare the numbers of inverters and transistors in the prior art of FIG. 9, the first embodiment of FIG. 1, and the second embodiment of FIG. 3. In the technology of the prior art in FIG. 9, three inverter stages and three pass transistor stages are required for carry output, and four inverter stages and three pass transistor stages are required for carry-out output, in one CSA cell (5-3 compressor circuit) stage. Hence when four stages, that is, four CSA cells (5-3 compressor circuits) are connected, 12-inverter stages and 12 pass transistor stages are required for carry output, and 16 inverter stages and 12 pass transistor stages are required for carry-out output.

On the other hand, in the first embodiment, three inverter stages and three pass transistor stages are required for the carry output, and three inverter stages and three pass transistor stages are required for the carry-out output, in one CSA cell (5-3 compressor circuit) stage. Hence when four stages, that is, four CSA cells (5-3 compressor circuits) are connected, only nine inverter stages and 12 pass transistor stages are required for carry output, and only nine inverter stages and 12 pass transistor stages are required for carry-out output.

Further, in the second embodiment, three inverter stages and three pass transistor stages are required for the carry output, and three inverter stages and three pass transistor stages are required for the carry-out output, in one CSA cell (5-3 compressor circuit) stage. Hence when four stages, that is, four CSA cells (5-3 compressor circuits) are connected, only 12 inverter stages and 12 pass transistor stages are required for carry output, and only 12 inverter stages and 12 pass transistor stages are required for carry-out output.

In this way, the number of pass transistor stages does not change, but the number of inverter stages can be decreased, and to this extent increases in delay time can be suppressed, and faster operation is possible. Further, in the first embodiment the number of inverter stages can be decreased the most, and faster operation is possible. Conversely in the second embodiment, the number of inverter stages can be decreased to a certain extent, and faster operation than in the prior art is possible, while increases in circuit scale can be suppressed, and increases in chip area can be suppressed.

Other Embodiments

In the above embodiments, examples of addition of the partial products in FIG. 7 and FIG. 8 were explained; but application to addition of partial products with other numbers of digits, and to addition of other numbers of partial products, is possible.

INDUSTRIAL APPLICABILITY

At least two carry-out EOR circuits, which output carry-out bits and the complementary signals thereof, are provided in a 5-3 compressor circuit comprising an EOR circuit group, and dual lanes are used at least for carry-out bits, so that the number of inverters required can be reduced, increases in delay time can be suppressed, and faster addition operation can be achieved, contributing to faster addition of partial products with numerous digits.

The invention claimed is:

1. A 5-3 compressor circuit for Carry-Save Adder (CSA) which receives four input signals and a lower-digit carry-out input, and computes addition bits, carry bits, and carry-out bits, comprising:
   four first-stage Exclusive-OR (EOR) circuits, which receive said four input signals and complementary signals of said four input signals, perform Exclusive-OR (EOR) computation of two input signals, and output two Exclusive-OR (EOR) outputs and complementary signals of said two Exclusive-OR (EOR) outputs;
   two second-stage Exclusive-OR (EOR) circuits, which receive the outputs of said four first-stage Exclusive-OR (EOR) circuits, perform Exclusive-OR (EOR) computation of said two Exclusive-OR (EOR) outputs, and output one Exclusive-OR (EOR) output and the complementary signal of said Exclusive-OR (EOR) output;
   a third-stage Exclusive-OR (EOR) circuit, which receives the outputs of said two second-stage Exclusive-OR (EOR) circuits and said carry-out bits, performs Exclusive-OR (EOR) computation of said Exclusive-OR (EOR) outputs and said carry-out bits, and outputs addition bits;
   a carry output Exclusive-OR (EOR) circuit, which receives the outputs of said two second-stage Exclusive-OR (EOR) circuits, said carry-out bits, and one of said four input signals, performs Exclusive-OR (EOR) computation of said Exclusive-OR (EOR) outputs, said carry-out bits, and said one input signal, and outputs carry bits; and two carry-out Exclusive-OR (EOR) circuits, which receive the outputs of said two first-stage Exclusive-OR (EOR) circuits and two complementary signals of said input signals, perform Exclusive-OR (EOR) computation of said two Exclusive-OR (EOR) outputs and said two complementary signals, and output said carry-out bits and the complementary signals thereof.

2. The 5-3 compressor circuit for Carry-Save Adder (CSA) according to claim 1, wherein said third-stage Exclusive-OR (EOR) circuit comprises a pair of Exclusive-OR (EOR) circuits, which receive the outputs of said two second-stage Exclusive-OR (EOR) circuits and said carry-out bits, perform Exclusive-OR (EOR) computation of said Exclusive-OR (EOR) outputs and said carry-out bits, and output addition bits and the complementary signals thereof, and wherein said carry output Exclusive-OR (EOR) circuit comprises a pair of Exclusive-OR (EOR) circuits, which receive the outputs of said two second-stage Exclusive-OR (EOR) circuits, said carry-out bits, and one of said four input signals, perform Exclusive-OR (EOR) computations of said Exclusive-OR (EOR) outputs, said carry-out bits, and said one input signal, and output carry bits and the complementary signals thereof.

3. The 5-3 compressor circuit for Carry-Save Adder (CSA) according to claim 2, wherein said four first-stage Exclusive-OR (EOR) circuits receive said four input signals and the complementary signals thereof from a data bus.

4. The 5-3 compressor circuit for Carry-Save Adder (CSA) according to claim 1, further comprising four inverters which generate the complementary signals of said four input signals.

5. The 5-3 compressor circuit for Carry-Save Adder (CSA) according to claim 4, wherein said four first-stage Exclusive-OR (EOR) circuits and said four inverters receive said four input signals from a data bus.

6. A carry-save adder circuit comprising:

a plurality of 5-3 compressor circuits for Carry-Save Adder (CSA), which receive four input signals and a lower-digit carry-out input, and compute addition bits, carry bits, and carry-out bits, and connected by said carry-out inputs, wherein each of said 5-3 compressor circuits for Carry-Save Adder (CSA) comprises:

four first-stage Exclusive-OR (EOR) circuits, which receive four input signals and complementary signals thereof, perform Exclusive-OR (EOR) computation of every two input signals, and output two Exclusive-OR (EOR) outputs and complementary signals thereof;

two second-stage Exclusive-OR (EOR) circuits, which receive the outputs of said four first-stage Exclusive-OR (EOR) circuits, perform Exclusive-OR (EOR) computation of said two Exclusive-OR (EOR) outputs, and output one Exclusive-OR (EOR) output and the complementary signal thereof;

a third-stage Exclusive-OR (EOR) circuit, which receives the outputs of said two second-stage Exclusive-OR (EOR) circuits and said carry-out bits, performs Exclusive-OR (EOR) computation of said Exclusive-OR (EOR) outputs and said carry-out bits, and outputs addition bits;

a carry output Exclusive-OR (EOR) circuit, which receives the outputs of said two second-stage Exclusive-OR (EOR) circuits, said carry-out bits, and one of said four input signals, performs Exclusive-OR (EOR) computation of said Exclusive-OR (EOR) outputs, said carry-out bits, and said one input signal, and outputs carry bits; and two carry-out Exclusive-OR (EOR) circuits, which receive the outputs of said two first-stage Exclusive-OR (EOR) circuits and two complementary signals of said input signals, perform Exclusive-OR (EOR) computation of said two Exclusive-OR (EOR) outputs and said two complementary signals, and output said carry-out bits and the complementary signals thereof.

7. The carry-save adder circuit according to claim 6, wherein said third-stage Exclusive-OR (EOR) circuit comprises a pair of Exclusive-OR (EOR) circuits, which receive the outputs of said two second-stage Exclusive-OR (EOR) circuits and said carry-out bits, perform Exclusive-OR (EOR) computation of said Exclusive-OR (EOR) outputs and said carry-out bits, and output addition bits and the complementary signals thereof, and wherein said carry output Exclusive-OR (EOR) circuit comprises a pair of Exclusive-OR (EOR) circuits, which receive the outputs of said two second-stage Exclusive-OR (EOR) circuits, said carry-out bits, and one of said four input signals, perform Exclusive-OR (EOR) computations of said Exclusive-OR (EOR) outputs, said carry-out bits, and said one input signal, and output carry bits and the complementary signals thereof.

8. The carry-save adder circuit according to claim 6, further comprising four inverters which generate the complementary signals of said four input signals.

9. The carry-save adder circuit according to claim 7, wherein said four first-stage Exclusive-OR (EOR) circuits in each of said 5-3 compressor circuits receives said four input signals and the complementary signals thereof from a data bus.

10. The carry-save adder circuit according to claim 8, wherein said four first-stage Exclusive-OR (EOR) circuits and said four inverters in each of said 5-3 compressor circuits receive said four input signals from a data bus.

11. The carry-save adder circuit according to claim 6, wherein said plurality of 5-3 compressor circuits are provided in a plurality of stages, and wherein the addition bits and said carry bits of said plurality of 5-3 compressor circuits of the initial stage are input to said plurality of 5-3 compressor circuits of the next stage.

12. The carry-save adder circuit according to claim 6, wherein said four input signals are signals of each of partial products in multiplication.

* * * * *